United States Patent [19]
Shimizu

[11] Patent Number: 4,491,747
[45] Date of Patent: Jan. 1, 1985

[54] LOGIC CIRCUIT USING DEPLETION MODE FIELD EFFECT SWITCHING TRANSISTORS

[75] Inventor: Shoichi Shimizu, Fujisawa, Japan

[73] Assignee: Tokyo Shibaura Denki Kabushiki Kaisha, Kawasaki, Japan

[21] Appl. No.: 427,725

[22] Filed: Sep. 29, 1982

[30] Foreign Application Priority Data

Sep. 30, 1981 [JP] Japan ................................ 56-155175
Dec. 11, 1981 [JP] Japan ................................ 56-198664

[51] Int. Cl.³ .................. H03K 19/094; H03K 19/20; H03K 19/003
[52] U.S. Cl. ................................ 307/446; 307/443; 307/450
[58] Field of Search ............... 307/443, 446, 450, 475, 307/363, 581, 264; 357/225

[56] References Cited

U.S. PATENT DOCUMENTS 3,969,632  7/1976  Bobenrieth ................... 307/450 X
4,038,563  7/1977  Zuleeg et al. ..................... 307/450
4,400,636  8/1983  Andrade ........................ 307/450 X

FOREIGN PATENT DOCUMENTS 0034235  4/1981  Japan ................................ 307/450
2059704  4/1981  United Kingdom ................ 307/450

OTHER PUBLICATIONS

Nuzillat et al., "A Subnanosecond Integrated Switching Circuit with MESFET's for LSI", IEEE JSSC, vol. SC-11, No. 3, Jun. 1976, pp. 385-394.
IEEE Journal of Solid-State Circuits, vol. SC. 13, No. 4, Aug. 1978, R. C. Eden et al., "Planar GaAs IC Technology: Applications for Digitla LSI".
Electronics Letters, vol. 16, No. 19 (Sep. 11, 1980), P. J. T. Mellor et al., "Capacitor-coupled logic using GaAs depletion-mode F.E.T.S.", pp. 749-750.
Elektronik, vol. 30, No. 4 (Feb. 27, 1981), "Integrationsdichte bei GaAs-ICs erhoht", p. 24.
IEEE Spectrum, vol. 14, No. 3, (Mar. 1977), R. Van Tuyl et al., Gallium arsenide spawns speed", pp. 41-47.

Primary Examiner—Larry N. Anagnos
Assistant Examiner—David R. Hudspeth
Attorney, Agent, or Firm—Oblon, Fisher, Spivak, McClelland & Maier

[57] ABSTRACT

A logic circuit using depletion-mode field effect switching transistors, wherein, a plurality of logic elements respectively having at least one depletion-mode switching FET are connected in series. The source electrodes of the switching FETs are maintained at a voltage higher by a predetermined voltage than ground potential by the Schottky diode and connected commonly to each other. The switching FETs are connected at the drain electrodes through active loads to a power source terminal supplied with one type of external DC power source voltage. The drain potential of the switching FETs is level-shifted to a predetermined voltage higher than the gate potential of the FETs in the next stage. The FETs are provided between the diodes and ground to prevent the variation in the level shift voltage.

20 Claims, 18 Drawing Figures

LOGIC CIRCUIT USING DEPLETION MODE FIELD EFFECT SWITCHING TRANSISTORS

BACKGROUND OF THE INVENTION

The present invention relates to a circuit for performing a predetermined logical function, and more particularly to a logic circuit which includes a plurality of logic elements comprised of depletion-mode field-effect transistors.

GaAs integrated-circuit fabrication technology has recently been developed. This technology has GaAs Schottky gate field-effect transistors (also known as an MESFET) and has developed the fabrication of digital IC for performing a predetermined logical function. Since the carrier mobility of GaAs substrate material was larger than that of Si substrate material, the above-mentioned digital IC could have carried out the logical function at an ultrahigh speed. It has been well known by those skilled in the art that a digital IC including a depletion-mode FET (also known as a normally-on type FET) has operated further at an ultrahigh speed. In the IEEE Journal of Solid-State Circuits, vol. SC-13, No. 4, August 1978 of FIG. 6 on page 423, a 4-input NOR-circuit employing a Schottky diode-FET logic (SDFL) circuit was disclosed.

However, the logic circuits comprised of the above-mentioned depletion-mode FETs have required two types of power source voltages, e.g., positive and negative voltages in operation. In other words, when the above-mentioned digital IC has been associated in a predetermined circuit arrangement for use, it has been designed to produce at least two types of power voltages for the above-mentioned IC. As a result, it had such disadvantages that the circuit of the connection of the power source has undesirably been complicated and the compact containment of the entire device has been prevented.

As a logic circuit which has solved the above-mentioned problems, there is a logic circuit called "a direct coupled FET logic (DCFL)", for example. This circuit is comprised of depletion-mode FETs serving as active loads and enhancement-mode FETs functioning as switching transistors. The enhancement-mode FETs connected commonly at the source electrode to each other have drain electrodes connected through the active loads to one positive potential power source voltage. At this time the source electrodes are grounded. Further, the drain electrode of one switching transistor is connected to the gate electrode of the switching transistor in the next stage. According to such circuit arrangement, forward voltage is applied between the gate and source electrodes of the enhancement-mode FETs as switching transistors. Thus, the gate potential of the switching FETs is clamped to the forward voltage (approx. 0.8 V) of Schottky. Therefore, the logic amplitude of the switching transistors has allowed narrow (e.g., reduced to 0.6 V) variation. As a consequence, the prior art logic circuit has such disadvantages that the noise margin voltage of the logic circuit is low and the noise resistance characteristics is deteriorated. When the above logic circuit is integrated in large scale or very large scale to be formed on one chip, the reduction of such noise margin voltage has been undesirably promoted, since the variation of the noise margin voltage of the switching transistors caused by the difference of the threshold voltage irregularity and/or fan out/in number should be further considered.

SUMMARY OF THE INVENTION

It is an object of the present invention to provide a new and improved circuit which is capable of performing a predetermined logical function at an ultrahigh speed.

It is another object of the present invention to provide a new and improved circuit which is capable of performing a predetermined logical function and operating with one type of power source voltage.

It is still another object of the present invention to provide a new and improved logic circuit which is capable of operating with one polarity of power source voltage and providing high reliability and stable operation.

In order to achieve the above and other objects, the logic circuit of the present invention has a plurality of logic elements connected in cascade to each other, and performs a predetermined logic function. Each of the logic elements includes at least one switching transistor. The switching transistors contained in the above logic elements are depletion-mode (normally-on) field effect transistors (FETs). The depletion-mode FETs have source electrodes commonly connected to each other and drain electrodes connected to a first terminal which is connected to an external power source and which is supplied with a first potential higher than a second potential at a second terminal connected to the external power source. The potential control device is connected between the source electrodes of the switching FETs and the second terminal, and functions to hold a predetermined third potential lower than the above first potential and higher than the second potential. Further, the level-shifting device shifts the levels of the drain electrodes of the respective switching FETs to a predetermined potential higher than the gate potential of the switching FET in the next stage and lower than the first potential.

DETAILED DESCRIPTION OF THE PREFERRED EMBODIMENTS

Figure 1:
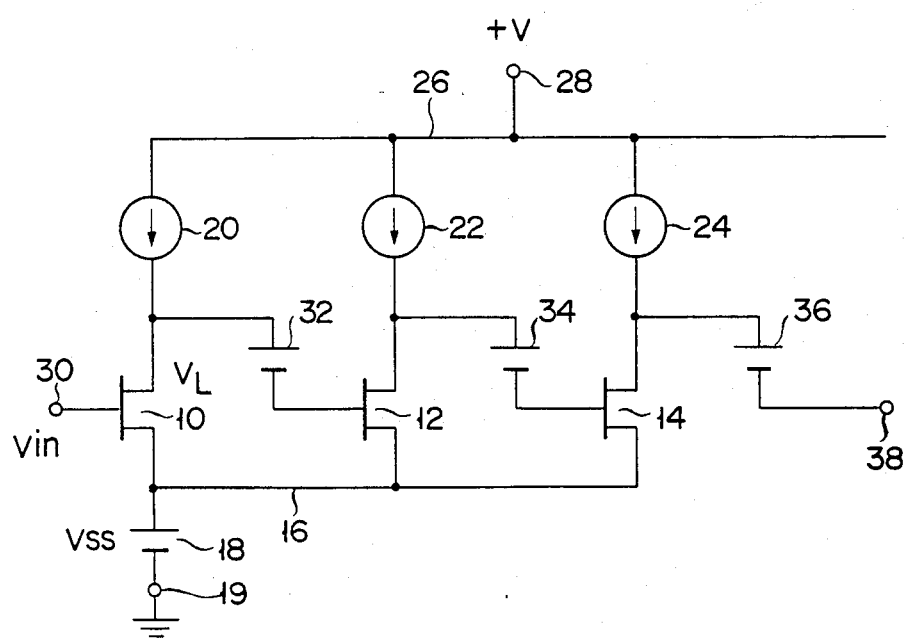
FIG. 1 is a principle diagram of a logic circuit of the present invention.

Referring now to FIG. 1, there is illustrated a principle circuit diagram of a logic circuit in accordance with the present invention. Switching transistors 10, 12 and 14 are comprised of depletion-mode FETs having a predetermined threshold voltage. The depletion-mode (normally-on) FETs 10, 12 and 14 are commonly connected at the source electrodes thereof via line 16 with each other. The line 16 is connected to the positive polarity electrode of a DC constant-voltage source 18 having a negative polarity electrode connected to ground through a terminal 19. When the potential of the DC constant-voltage source 18 is Vss, the line 16 is maintained at a voltage higher by the constant potential Vss than the ground potential. In this state, depletion-mode FETs having a threshold voltage ($|V_{th}| \leq |V_L|$) substantially equal to $-V_{ss}$ are selected as the switching transistors 10, 12 and 14. The drain electrodes of the switching FETs 10, 12 and 14 are connected through current source loads 20, 22 and 24 to a line 26. A predetermined DC power source voltage $+V$ is supplied through a power source terminal 28 to the line 26. The gate electrode of the first switching FET 10 is connected to an input terminal 30. The drain electrode of the first FET 10 is further connected to the gate electrode of a second switching FET 12 in the next stage in sequence through the positive polarity electrode and negative polarity electrode of a DC constant-voltage source 32 of constant voltage $V_L$. Therefore, the drain potential of the first FET 10 is shifted by a voltage $V_L$ from the gate potential of the second FET 12. The drain electrode of the second FET 12 is connected further to the gate electrode of the third FET 14 in the next stage through a level shifting constant-voltage source 34. The drain electrode of the third FET 14 is connected through a level shifting constant-voltage source 36 to an output terminal 38.

When the input voltage applied to the input terminal 30 is near the ground potential in the NOT-circuit in FIG. 1, the voltage between the gate and source electrodes of the first switching transistor comprised of a depletion-mode FET 10 is substantially equal to the threshold voltage $-V_{ss}$ of the depletion-mode FET 10. Therefore, the first switching transistor 10 enters a pinch-off state, and no current will flow to the FET 10. At this time the drain potential $V_{d1}$ of the first FET 10 is:

$$V_{d1} = V_{sj} + V_{ss} + V_L \quad (1)$$

where, $V_{sj}$: Schottky junction voltage ($\infty 0.8$ V) Because the junction between the gate and source electrodes of the second switching FET 12 in the next stage enters Schottky junction state, it is forwardly biased with the result that the gate electrode of the second FET 12 is clamped to a voltage higher by Schottky junction voltage $V_{sj}(\infty 0.8 \text{ V})$ forwardly than the source potential ($=V_{ss}$) thereof and hence Vss $+0.8$ volts.

Therefore, the drain-source voltage $V_{ds}$ of the first FET 10 becomes:

$$V_{ds} = V_{sj} + V_L \infty 0.8 + V_L \quad (2)$$

Figure 2:
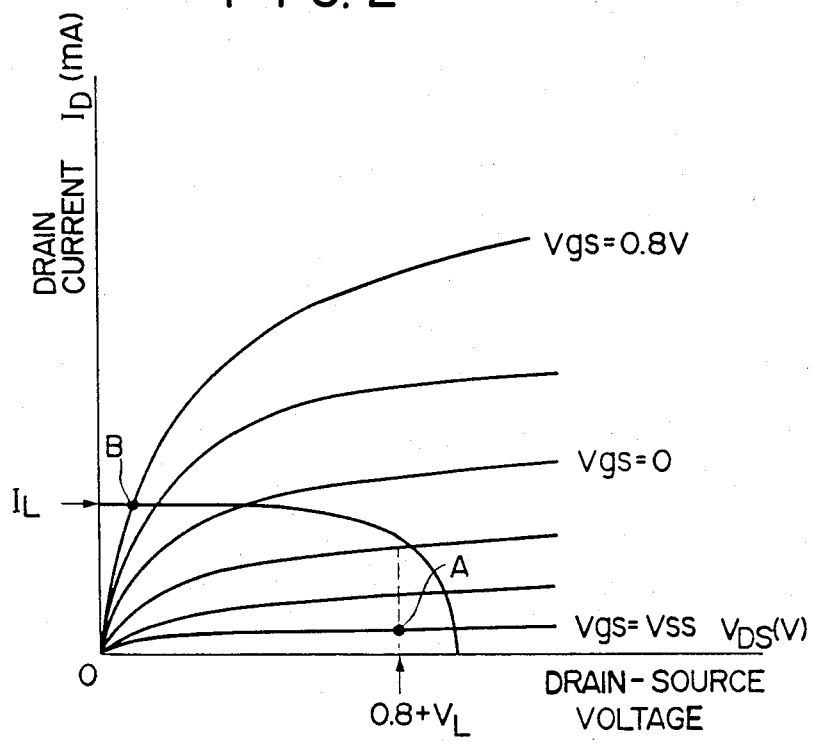
FIG. 2 is a graphic diagram showing the voltage-current characteristics of the logic circuit shown in FIG. 1.

This state corresponds to a point A in the voltage-current characteristic diagram shown in FIG. 2.

In this state, the second switching FET 12 enters a conductive state. Because the gate potential of the second FET 12 is higher by 0.8 volt than the source potential thereof. Therefore, the drain potential of the second FET 12 is lowered to a potential substantially equal to the source potential thereof and corresponding to logic "0" value. The drain-source voltage $V_{ds}$ of the second FET 12 is substantially zero volt. The state of the second FET 12 corresponds to a point B in the characteristic diagram in FIG. 2, and a current flowing through the FET 12 is a load current $I_{L2}$ from a current source load 22. Incidentally, a load current $I_{L1}$ from the current source load 20 flows through the gate electrode of the second FET 12 to the source electrode thereof. The operating state of the third switching FET 14 is substantially equal to the first switching FET 14.

Figure 3:
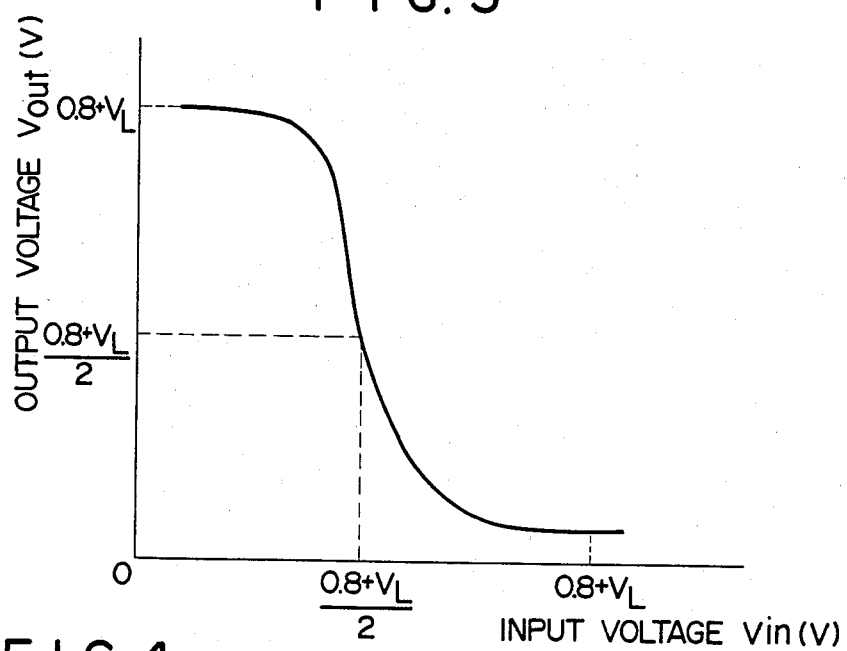
FIG. 3 is a graphic diagram showing the input-output voltage characteristics of the logic circuit in FIG. 1.

FIG. 3 shows an input and output voltage characteristic diagram illustrating the potential variation at the gate electrode of the FET 12 when the input voltage Vin applied to the input terminal 30 gradually increases toward a positive direction. When the input voltage Vin applied to the input terminal 30 exceeds $(0.8+V_L)/2$ volts, the first switching FET 10 starts being forwardly biased, and when it becomes $(0.8+V_L)$ volts, the intermediary between the gate and drain electrodes of the FET 10 enters the Schottky junction state and is forwardly biased. Therefore, the drain potential of the first FET 10 is lowered to a potential Vss substantially equal to the source potential thereof. In other words, the logical amplitude of the logic circuit for performing the logic NOT function in FIG. 3 becomes substantially $(0.8+V_L)$ volts.

Therefore, according to the logic circuit of the present invention shown in FIG. 1, depletion-mode FETs switching at an extremely high speed can be composed as a switching element without using an enhancement-mode FET. Accordingly, the arithmetic operation can be performed at an extremely high speed. Further, in the above operation, the required external power source voltage may be only one type of voltage $+V$. Since the logic amplitude can further take at least 0.8 volt or higher, its noise margin can be extended, and high reliability can be provided with stable operation. Simultaneously, since the margin of the variation in the noise margin voltage caused by the difference of the threshold voltage irregularity and/or fan out/in number can be increased, a logic circuit adapted for an LSI or a VSLI can be provided. In addition, in the above-mentioned principle diagram, the simple NOT-circuit is, for better understanding, illustrated, but the present invention is not limited only to this. For example, the present invention may be applied to other logic circuit which contains an NOR-circuit and an NAND-circuit without departing from the spirit and scope of the present invention.

Figure 4:
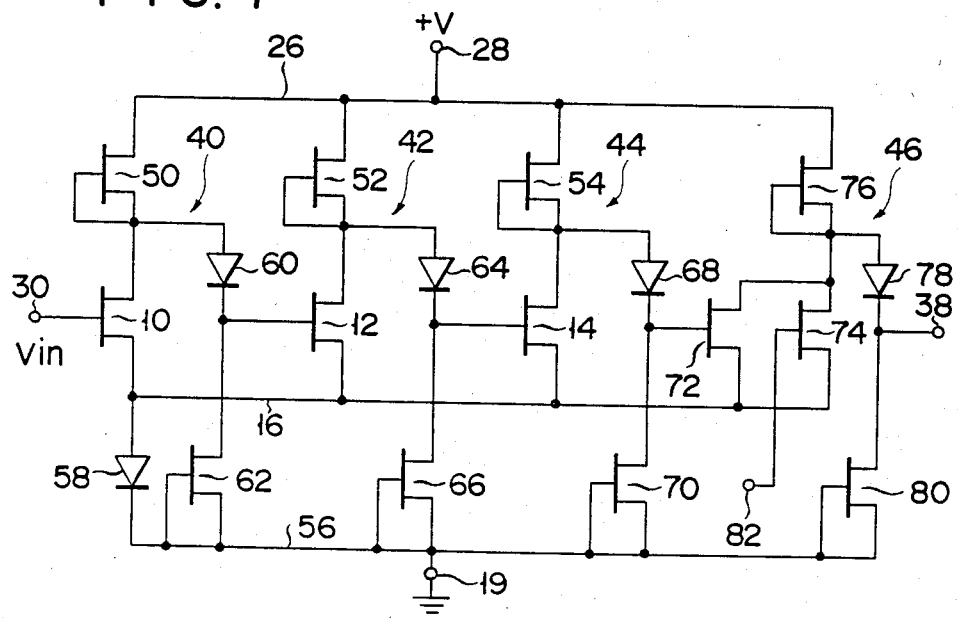
FIG. 4 is a circuit diagram of the logic circuit comprised of three inverter circuits and one NOR-circuit connected in cascade according to one embodiment of the present invention.

FIG. 4 shows a concrete embodiment of the principle circuit diagram of the logic circuit of the above-mentioned present invention. The same circuit elements as those in FIG. 1 are designated by the same reference numerals.

Figure 5:
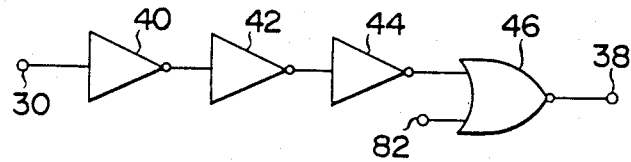
FIG. 5 is a equivalent circuit diagram of the logic circuit in FIG. 4.

The logic circuit in FIG. 4 is comprised, as shown in an equivalent circuit shown in FIG. 5, of 3 inverters 40, 42 and 44 and one NOR-circuit 46, for example. The drain electrodes of the first to third switching transistors 10, 12 and 14 comprised of depletion-mode Schottky gate FETs are connected to a line 26, which is connected to a power source terminal 28 supplied with a power source voltage +V, through depletion-mode Schottky gate transistors 50, 52 and 54. The gate electrodes of the FETs 50, 52 and 54 are respectively connected to source electrodes thereof. Therefore, these FETs 50, 52 and 54 serve as constant-current sources having substantially infinitive source resistance and hence active loads.

A Schottky diode 58 is provided between a line 16 commonly connected with the source electrodes of the first to third switching FETs 10, 12 and 14 and a line 56 connected to ground. The Schottky diode 58 has an anode electrode connected to the line 16 and a cathode electrode connected to the line 56. With this diode 58 the potential of the line 16 and hence the source potential of the first to third switching FETs 10, 12 and 14 is maintained at a potential higher by a predetermined positive voltage Vss than the ground potential. In this case, the voltage Vss is the forward voltage of the diode 58 and is 0.8 volt.

The drain electrode of the first switching FET 10 is connected to the gate electrode of the second switching FET 12 in the next stage through the Schottky diode 60. The cathode electrode of the diode 60 is connected to the gate electrode of the second FET 12 and further connected to the drain electrode of a depletion-mode Schottky gate FET 62. The gate and source electrodes of this FET 62 are commonly connected to the line 56. The Schottky diode 60 functions as a level shifting constant-voltage source and thereby produces a level shifting voltage $V_L$. In this case, the level shifting voltage $V_L$ is the forward voltage (approx. 0.8 volt) of the Schottky diode 60. The FET 62 connected between the diode 60 and the ground maintains constantly the level shifting voltage and serves as a current source having a current value smaller than the current value of the active load FET 50.

The drain electrode of the second switching FET 12 is similarly connected to the gate electrode of the third switching FET 14 disposed in the further next stage through a level shifting Schottky diode 64. The cathode electrode of the level shifting diode 64 is connected to the ground line 56 through a depletion-mode Schottky gate FET 66 for holding the level shifting voltage. The drain electrode of the third switching FET 14 is connected to the earth line 56 through a level shifting Schottky diode 68 and a level shifting voltage holding depletion-mode Schottky gate FET 70.

The cathode electrode of the Schottky diode 68 is connected to the gate electrode of one of the depletion-mode Schottky gate switching FETs 72 and 74 forming the inputs of NOR-circuit 46 provided in parallel with each other, e.g., the gate electrode of the FET 72. The drain electrodes commonly connected to each other of the NOR-input FETs 72 and 74 are connected to the power source line 26 through a depletion-mode Schottky gate FET 76 as a constant-current source. The drain electrodes are further connected to the output terminal 38 through a level shifting Schottky diode 78. The cathode electrode of this diode 78 is connected to an ground line 56 through a level shifting voltage holding depletion-mode Schottky gate FET 80. The gate electrode of the other NOR-input FET 74 is connected to a terminal 82. In such a circuit arrangement, a constant current corresponding to the difference between the sum of the currents of the current source loads 50, 52, 54 and 76 and the sum of the currents of the current sources 62, 66, 70 and 80 flows constantly through the diode 58. Therefore, the diode 58 functions as a voltage source having a constant voltage Vss.

According to one embodiment of the present invention thus comprised, the depletion-mode Schottky gate FETs 50, 52, 54 and 76 are utilized as current source loads provided between the power source line 26 and the switching FETs 10, 12, 14, 72 and 74. The Schottky diodes 60, 64, 68 and 78 are utilized as level shifting constant-voltage sources. In order to maintain the source potential of the above-mentioned switching FETs 10, 12, 14, 72 and 74 at a voltage higher by a predetermined voltage than the ground potential, at least one Schottky diode 58 is provided. Thus, the peculiar advantages and effects of the present invention described above can be obtained. In addition, the threshold voltage of the switching FETs 10, 12, 14, 72 and 74 contained in the logic circuit in FIG. 4 becomes approx. −0.8 volt and the logic amplitude thereof becomes approx. 1.6 volts.

FIGS. 6 to 11 each illustrate modified examples of the above-mentioned logic circuit in FIG. 4, and their equivalent circuits are all similar to the circuit in FIG. 5. In the logic circuits shown in FIGS. 6 to 11, the same circuit elements as those in FIG. 4 are designated by the same reference numerals, and the description will be omitted.

Figure 6:
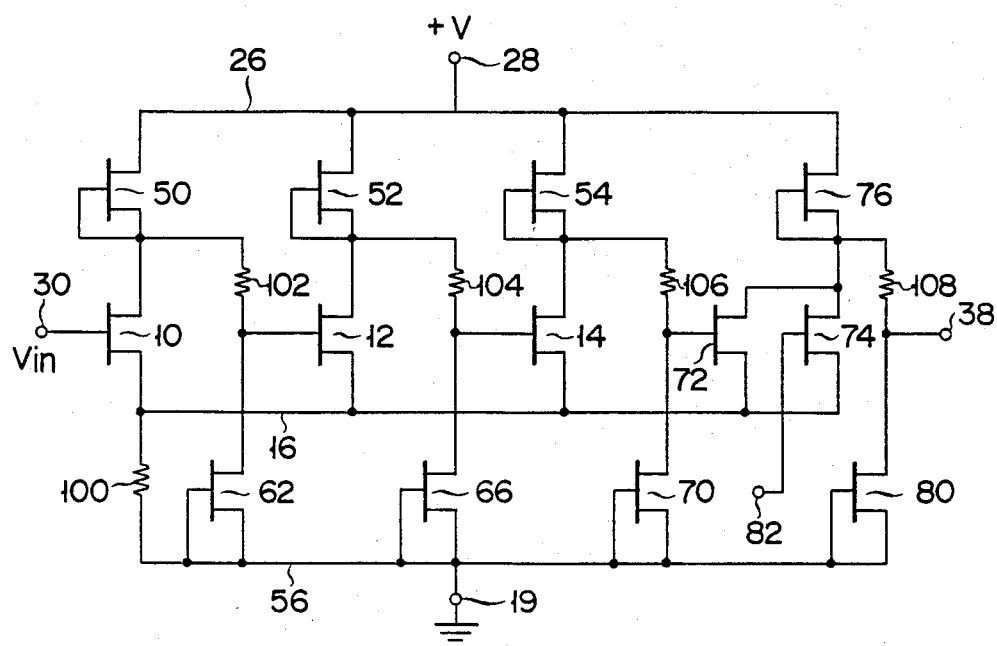
FIGS. 6 to 11 are circuit diagrams of modified examples of the logic circuit in FIG. 4.

In the logic circuit in FIG. 6, a resistor 100 is provided as a constant-voltage source for determining the source potential of switching FETs 10, 12, 14, 72 and 74. A current flowing through the resistor 100 is equal to a value corresponding to the difference between the sum of the currents of all the currents of current source loads 50, 52, 54 and 76 and the sum of the currents of current sources 62, 66, 70 and 80 and is always substantially constant. Therefore, the source potential of the FETs 10, 12, 14 and 16 is maintained higher than the ground potential at a potential corresponding to the product of the resistance of the resistor 100 and the constant current value. In order to represent the above relationship by an equation, the source potential of the FETs 10, 12, 14, 72 and 74 is designated by $V_s$:

$$V_s = R_f(\Sigma I_i - \Sigma I_j) \tag{3}$$

where
$R_f$: the resistance of the resistor 100
$\Sigma I_i$: the sum of the currents of the FETs 50, 52, 54 and 76 as current source loads
$\Sigma I_j$: the sum of the currents of the FETs 62, 66, 70, and 80 as current sources.
Further, resistors 102, 104, 106 and 108 are provided to function as level shifting constant voltage sources in the above-mentioned logic circuit.

Figure 7:
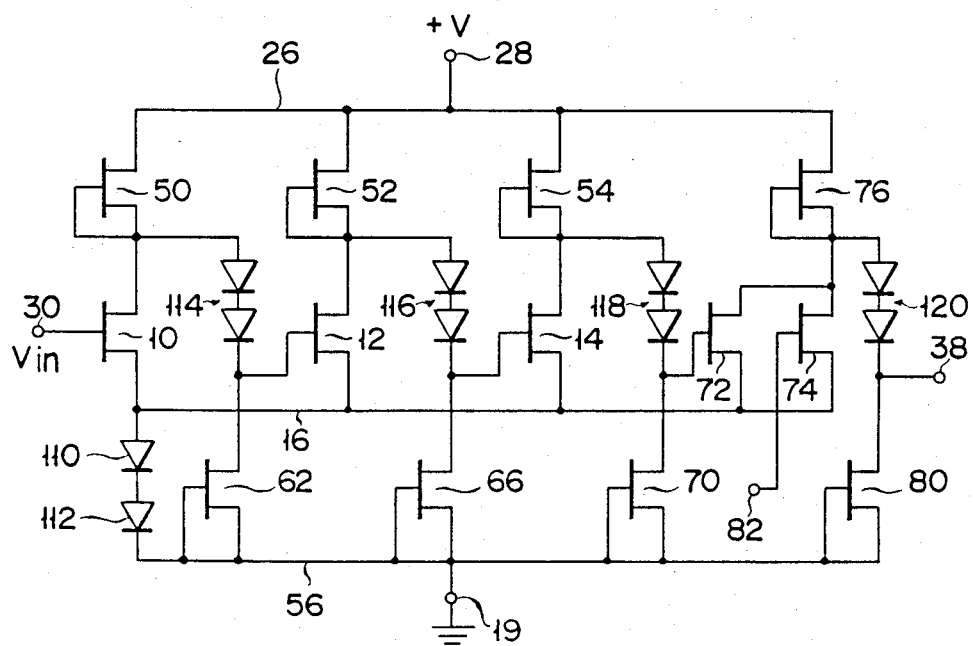

According to the logic circuit in FIG. 7, in order to maintain the source potentials of the switching FETs 10, 12, 14, 72 and 74 at a voltage higher by a predetermined voltage than the ground potential, a series circuit of two Schottky diodes 110 and 112 is connected between the source line 16 and the ground line 56. The anode electrode of the Schottky diode 110 is connected to the line 16, and the cathode electrode of the other Schottky diode 112 is connected to the ground line 56.

Series circuits 114, 116, 118 and 12 of the respective two Schottky diodes are provided to serve as level shifting constant voltage sources. According to this circuit arrangement, the logic amplitude of the switching FETs 10, 12, 14, 72 and 74 becomes $0.8+2V_L \infty 2.4$ volts, and can be further extended. Incidentally, the threshold voltage $V_{th}$ of the switching FETs 10, 12, 14, 72 and 74 is set as below.

$$|V_{th}| \leq |2V_L| \qquad (4)$$

Figure 8:
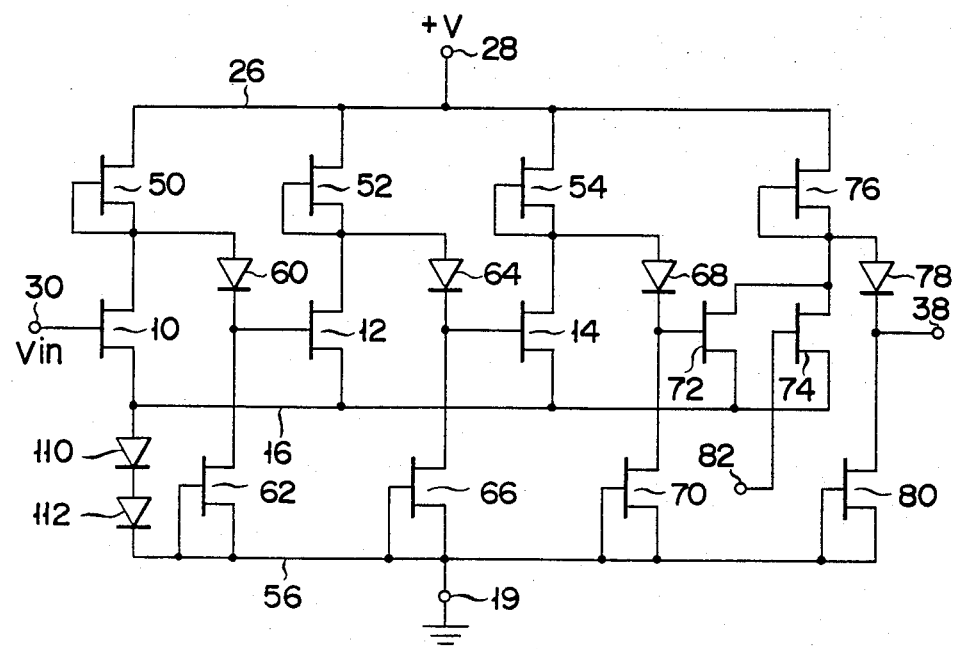

According to the logic circuit of FIG. 8, the drain potential of the current source FETs 62, 66, 70 and 80 is maintained higher by potential Vss than the ground potential. Thus, preferable constant-current operation can be performed. In this case, the gate potential of the switching FETs 10, 12, 14, 72 and 74 varies from the Vss to $(0.8+2V_L)$ volts, and the logic amplitude of these FETs 10, 12, 14, 72 and 74 is $0.8+V_{ss} \infty 1.6$ volts.

Figure 9:
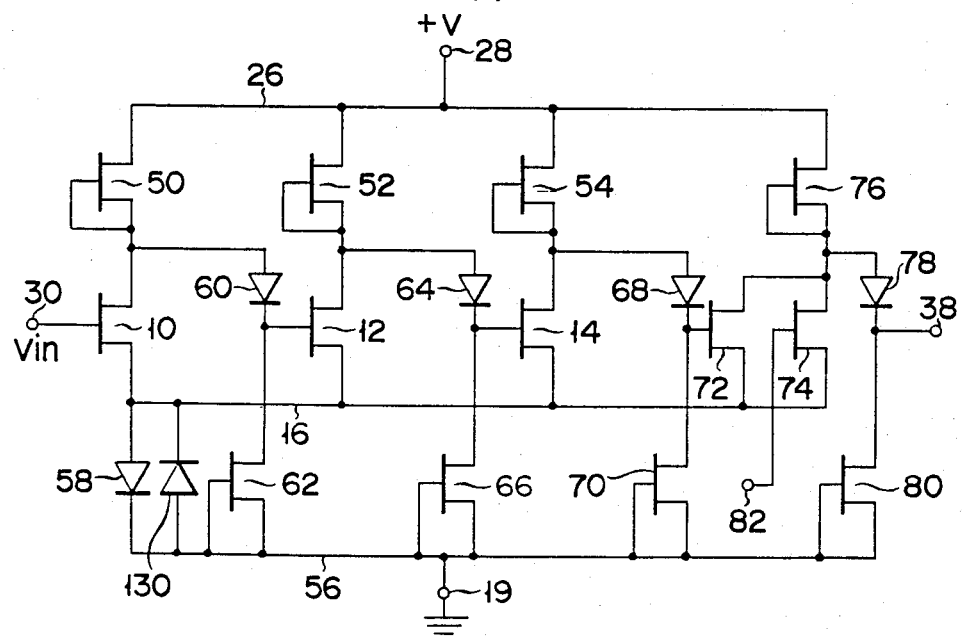

FIG. 9 illustrates the logic circuit comprised of a circuit arrangement in which a further Schottky diode 130 is connected parallel to the Schottky diode 58 of the logic circuit in FIG. 4 and in anti-parallel to the diode 58. Since the diode 130 is reverse-biased, it substantially serves as a capacitor. In other words, this diode 130 serves as a decoupling capacitor which absorbs the pulse noise generated at the source line 16 when the switching FETs 10, 12, 14, 72 and 74 operate in switching action at a high speed.

Figure 10:
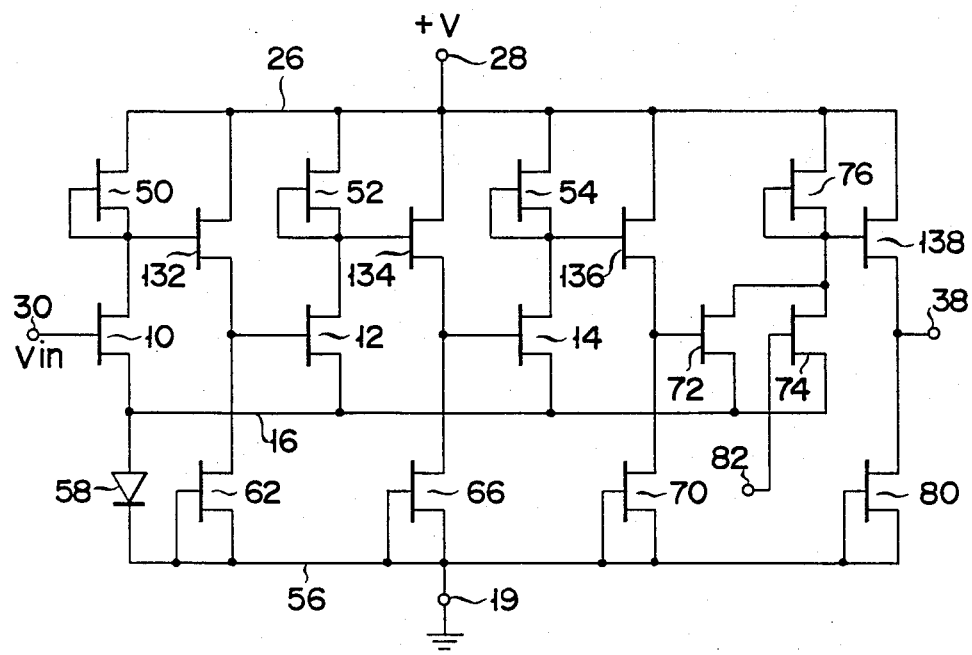

According to a logic circuit of FIG. 10, depletion-mode Schottky gate FETs 132, 134, 136 and 138 are each utilized as level shifting constant voltage sources. The FETs 132, 134, 136 and 138 are connected at the drain electrodes to a power source line 26. The gate electrodes of the FETs 132, 134 and 136 are respectively connected to the drain electrodes of the first to third switching FETs 10, 12 and 14. The source electrodes of the FETs 132 and 134 are respectively connected to the gate electrodes of the second and third switching FETs 12 and 14 each provided in the next stage thereof. The source electrode of the level shifting FET 136 is connected to the gate electrode of the switching FET 72 forming one input of the NOR-circuit 46 (FIG. 5). The gate electrode of the remaining level shifting FET 138 is commonly connected to the drain electrodes of the input FETs 72 and 74 of the NOR-circuit 46, and the source electrode of the FET 138 is connected to the output terminal 38. Simultaneously, the level shifting FETs 132, 134, 136 and 138 are so set that the current values of the FETs 132, 134, 136 and 138 become substantially equal to those of the current source FETs 62, 66, 70 and 80, when the source to gate voltage of the FETs 132, 134, 136 and 138 is positive. Therefore, the driving capacity to the next stage can be increased by the level shifting FETs 132, 134, 136 and 138 of the source follower.

Figure 11:
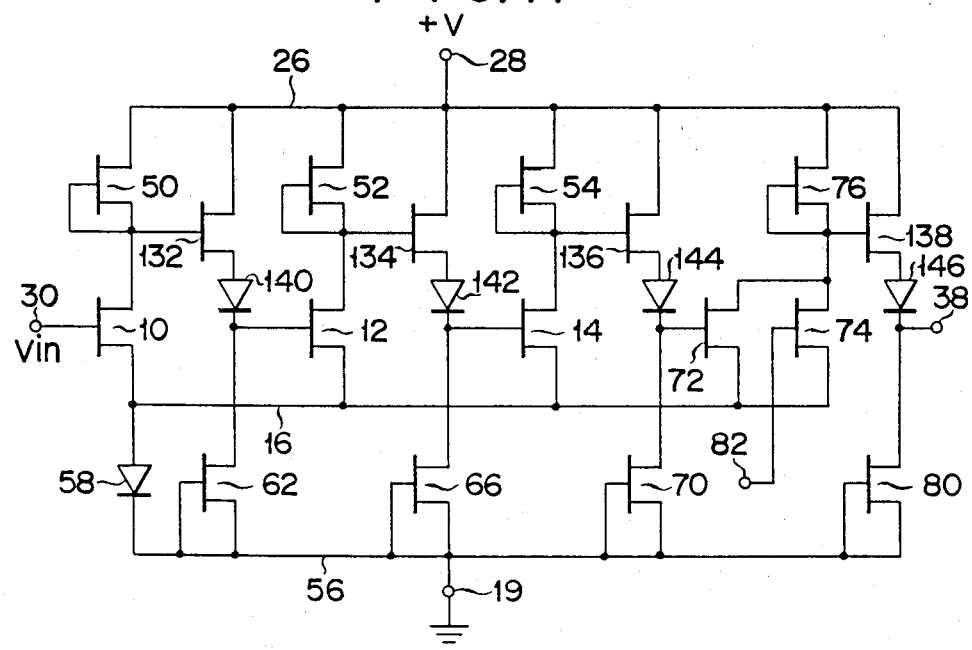

According to the logic circuit of FIG. 11, Schottky diodes 140, 142, 144 and 146 are newly provided at the source electrodes of the level shifting FETs 132, 134, 136 and 138. In other words, a combination circuit of the depletion-mode Schottky gate FET and the Schottky diode of the source follower serves as a level shifting constant voltage source.

Figure 12:
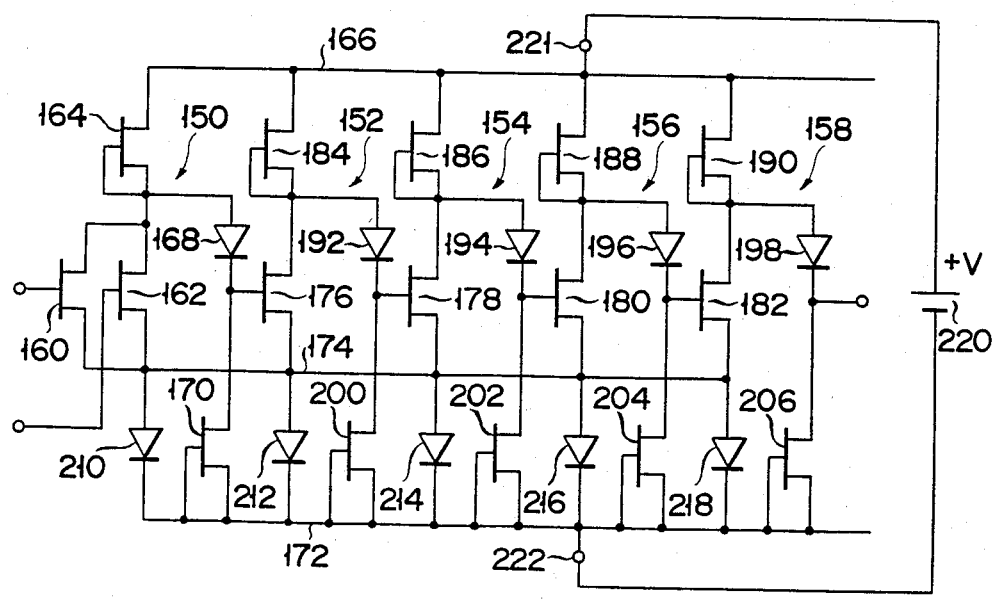
FIG. 12 is a circuit diagram a logic circuit comprised on one NOR-circuit and four inverter circuits connected in cascade according another embodiment of the present invention.
Figure 13:
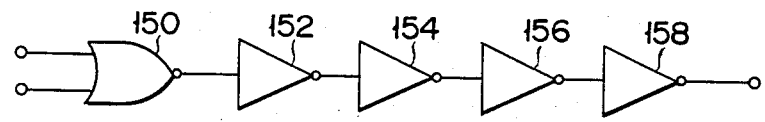
FIG. 13 is an equivalent circuit diagram of the logic circuit in FIG. 12.

Referring now to FIGS. 12 and 13, there is illustrated a logic circuit according to another embodiment of the present invention. The logic circuit in FIG. 12 is comprised of one NOR-circuit 150 and four inverter circuits 152, 154, 156 and 158 connected in series as shown in an equivalent circuit in FIG. 13.

In FIG. 12, the NOR-circuit 150 includes switching transistors 160 and 162 connected in parallel with each other and comprised of depletion-mode Schottky gate FETs. The drain electrodes of the FETs 160 and 162 are commonly connected to each other and are connected to a power source line 166 through a depletion-mode Schottky gate FET 164 serving as a current source load. The drain electrodes of the FETs 160 and 162 are connected to a ground line 172 through a level shifting Schottky diode 168 and a depletion-mode Schottky gate FET 170 functioning as a current source. The source electrodes of the FETs 160 and 162 are commonly connected to the line 174.

The inverters 152, 154, 156 and 158 include switching transistors 176, 178, 180 and 182 comprised of depletion-mode Schottky gate FETs, depletion-mode Schottky gate FETs 184, 186, 188 and 190 as current source load, Schottky diodes 192, 194, 196 and 198 as level shifting constant voltage source, and depletion-mode Schottky gate FETs 200, 202, 204 and 206 as current sources, respectively. The circuit arrangement of the inverters is fundamentally similar to the circuit arrangement corresponding to that in FIG. 4, and accordingly will not be described. However, in the logic circuit of FIG. 12, in order to maintain the potential of the source line 174 and hence the source potential of the switching FETs 160, 162, 176, 178, 180 and 182 at a potential higher by a predetermined voltage than the ground potential, a plurality of, for example, five Schottky diodes 210, 212, 214, 216 and 218 are provided corresponding to the number of the above-mentioned logic elements 150, 152, 154, 156 and 158. A sole DC constant-voltage source 220 is connected between the power terminal 221 connected to the power line 166 and the ground terminal 222 connected to the ground line 172.

The above-mentioned advantages can be also obtained even in the above described embodiment of the present invention. Further, a plurality of diodes 210, 212, 214, 216 and 218 are provided between the source line 174 and the ground line 172. Therefore, a current from the source line 174 is dispersively flowed to the plural diodes. In this manner, the current capacity of each diode can be reduced, and accordingly the pattern areas of the respective diodes can be reduced.

Figure 14:
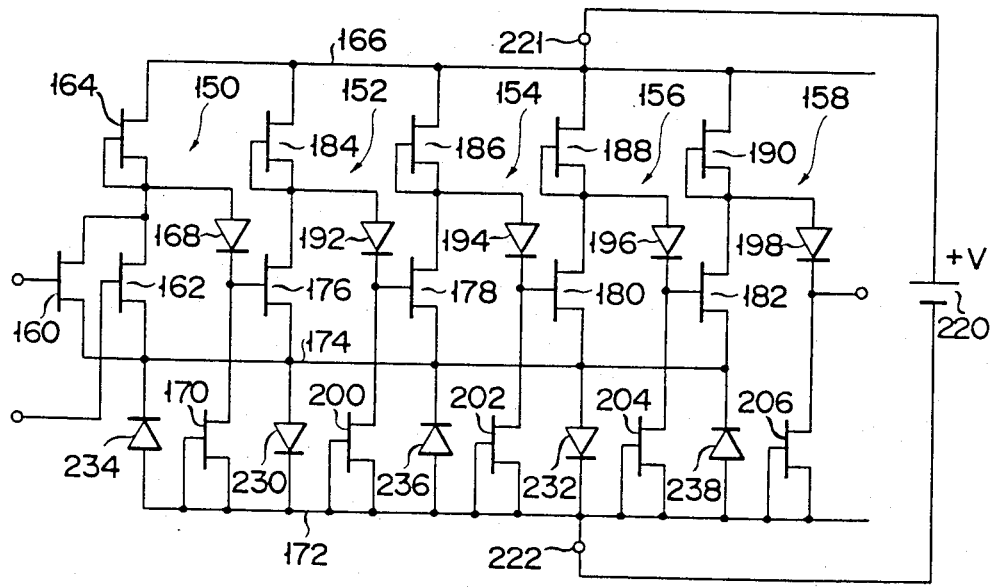
FIG. 14 is a circuit diagram of the modified example of the logic circuit in FIG. 13.

FIG. 14 illustrates a modified embodiment of the logic circuit in FIG. 13 described as above. Two Schottky diodes 230 and 232 are, for example, provided between the source line 174 and the ground line 172. In other words, the anode electrodes of the diodes 230 and 232 are connected to the source line 174 and the cathode electrodes are connected to the ground line 172. Further, a plurality of, for example, three Schottky diodes 234, 236 and 238 are connected between the lines 172 and 174. The diodes 134, 136 and 138 are connected in reverse polarity to the two diodes 230 and 232. Therefore, the two diodes 230 and 232 serve to hold the source potential of the switching FETs 160, 162, 176, 178, 180 and 182 at a voltage higher by a predetermined voltage than the ground potential. On the other hand, the three diodes 234, 236 and 238 function to absorb the pulse noise as a junction capacity.

Figure 15:
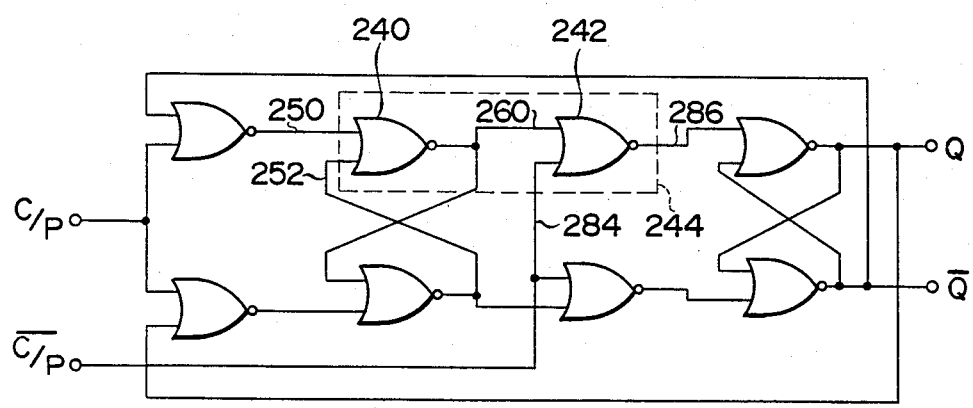
FIG. 15 is a circuit diagram showing the circuit arrangement of a known master-slave type flip-flop comprised of NOR-circuits.
Figure 16:
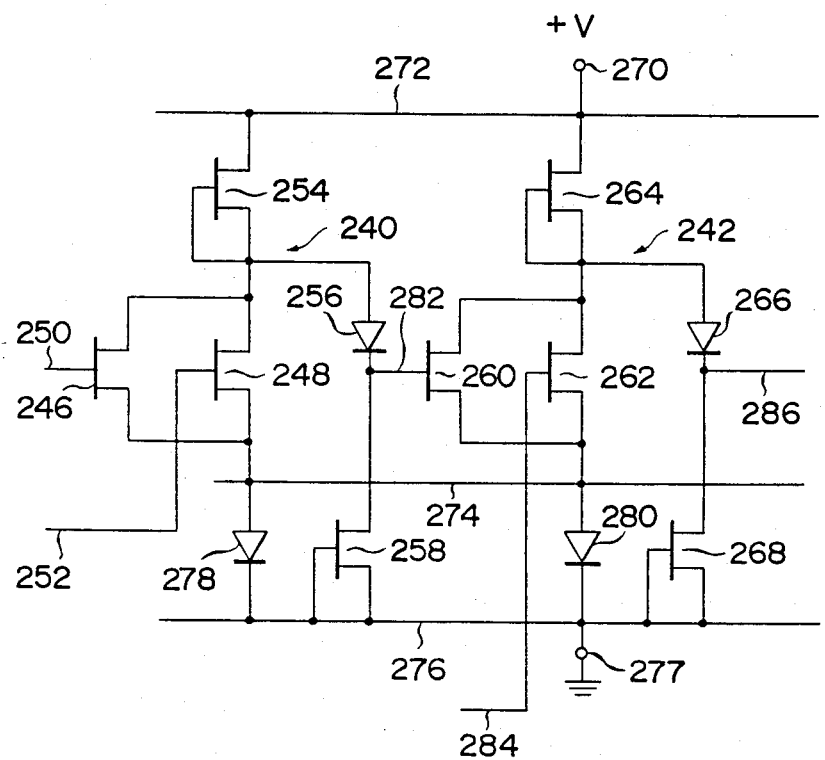
FIG. 16 is a circuit diagram of the logic circuit corresponding to the circuit portion surrounded by the dotted line of the circuit in FIG. 15 according to still another embodiment of the present invention.

FIG. 15 shows a circuit arrangement of a known master-slave type flip-flop circuit. The flip-flop circuit of FIG. 15 is fundamentally comprised of a plurality of NOR-circuits. The present invention can be applied to such a flip-flop. FIG. 16 illustrates the preferred embodiment of the present invention corresponding to two NOR-circuits 240 and 242 surrounded by a dotted line 144 of the flip-flop of FIG. 15 as an example.

In FIG. 16, the NOR-circuit 240 includes two depletion-mode Schottky gate FETs 246 and 248 connected in parallel with each other. The gate electrodes of these switching transistors 246 and 248 are respectively connected to the signal input lines 250 and 252. The NOR-circuit 240 further includes a depletion-mode Schottky gate FET 254 serving as a current source load, a level shifting Schottky diode 256 and a depletion-mode Schottky gate FET 258 as a current source, and is connected similarly as described above (e.g., similarly to the NOR-circuit 46 in the logic circuit in FIG. 4). The other NOR-circuit 242 includes two depletion-mode Schottky gate FETs 260 and 262 as switching transistors, a depletion-mode Schottky gate FET 264 as a current source load, a level shifting Schottky diode 266 and a depletion-mode Schottky gate FET 268 as a current source, and is similarly connected to the above-mentioned NOR-circuit 240. A predetermined power source voltage +V is supplied to a power source terminal 270 connected to a power source line 272. A plurality of e.g., two Schottky diodes 278 and 280 are provided corresponding to the number of the logic elements 240 and 242 between a lead line 274 connected with the source electrodes of the switching FETs 246, 248, 260 and 262 contained in both NOR-circuits 240 and 242 and a ground line 276 connected to ground through a terminal 277. The source potential of the switching transistors 246, 248, 260 and 262 is maintained by the diodes 278 and 280 as raised from the ground potential. Reference numerals 282 and 284 denote signal input lines of the NOR-circuit 242, a reference numeral 286 denotes the signal output line of the NOR-circuit 242. The peculiar advantages of the present invention can also be obtained similarly with such circuit arrangement.

Figure 17:
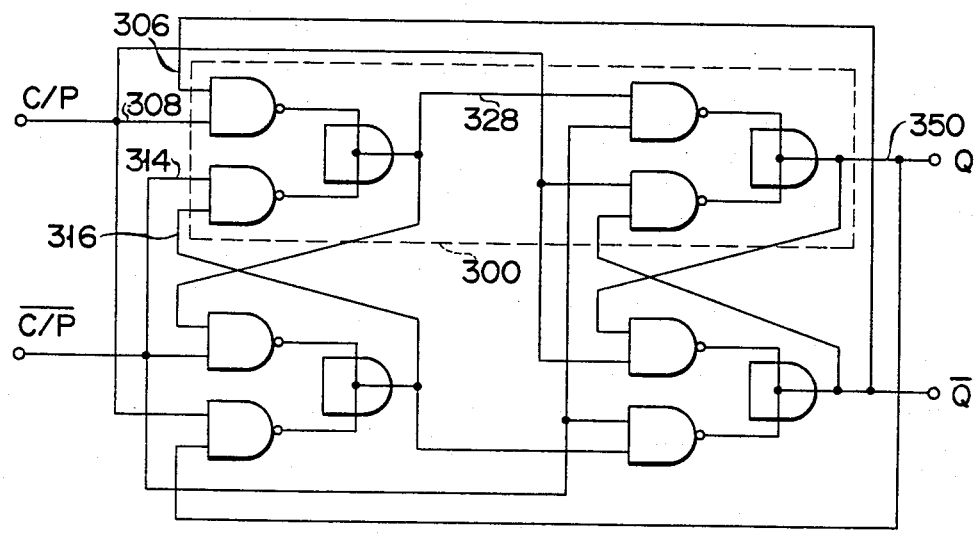
FIG. 17 is a circuit diagram of a known master-slave type flip-flop comprised of NAND-circuits.
Figure 18:
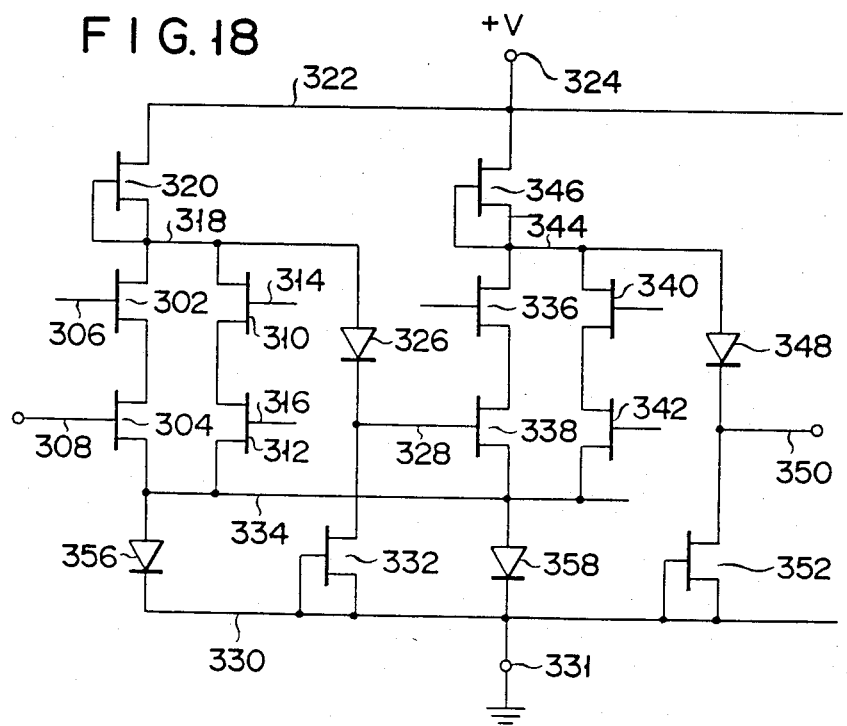
FIG. 18 is a circuit diagram of the logic circuit corresponding to the circuit portion surrounded by dotted line of the circuit in FIG. 17 according to still another embodiment of the present invention.

The master-slave type flip-flop shown in FIG. 17 is comprised mainly of NAND-circuits. The present invention can be applied to such flip-flop circuit. FIG. 18 illustrates the preferred embodiment of the present invenion corresponding to the circuit portion surrounded by a dotted line 300 of the flip-flop circuit, for example, in FIG. 17.

In FIG. 18, depletion-mode Schottky gate FETs 302 and 304 having gate electrodes connected respectively to signal input lines or leads 306 and 308 are connected in series with each other. A series circuit of switching FETs 310 and 312 is connected in parallel with a series circuit of the switching FETs 302 and 304. The FETs 310 and 312 are comprised of depletion-mode Schottky gate FETs. The gate electrodes of the FETs 310 and 312 are respectively connected to signal input lines 314 and 316. The drain electrodes of the FETs 302 and 310 are connected to each other via a lead line 318 and are connected to a power source line 322 through a current source load 320 comprised of the depletion-mode Schottky gate FET. The power line 322 is connected to a power source terminal 324 supplied with power source voltage +V.

The line 318 is connected to a signal line 328 through a level shifting Schottky diode 326, and is further connected to a ground line 330 through the depletion-mode Schottky gate FET 332 serving as a current source. The ground line 330 is connected to ground through a terminal 331. The source electrodes of the FETs 304 and 312 are commonly connected to a lead line 334.

Similarly, switching transistors 336 and 338 are connected in series with each other. A series circuit of switching transistors 340 and 342 is connected in parallel with this series circuit. The switching transistors 336, 338, 340 and 342 are all comprised of depletion-mode Schottky gate FETs. The drain electrodes of the FETs 336 and 340 are commonly connected to a lead line 344, and are connected to the power source line 322 through a depletion-mode Schottky gate FET 346 serving as a current source load. The line 344 is connected to the signal output line 350 through a level shifting Schottky diode 348 and is further connected to the ground line 330 through a depletion-mode Schottky gate FET 352 functioning as a current source.

The source electrodes of the FETs 338 and 342 are commonly connected to the line 334. At least one, e.g., two Schottky diodes 356 and 358 are provided between the source line 334 and the ground line 330. The source potential of the above-mentioned switching FETs 304, 312, 338 and 342 are maintained at a voltage higher by a predetermined voltage than the ground potential by the diodes 356 and 358. The operation of the logic circuit of the present invention can also be performed even in such a circuit arrangement fundamentally similarly to that described with reference to FIG. 1, thereby obtaining the peculiar advantages of the present invention as described above.

Although the present invention has been shown and described with respect to particular embodiments, nevertheless, various changes and modifications which are obvious to a person skilled in the art to which the invention pertains are deemed to lie within the spirit, scope and contemplation of the invention. In the embodiments described above, all the diodes are Schottky diodes but are not limited only to these, and another diodes such as P-N junction diodes may be employed. The level shifting may also be performed by utilizing the breakdown voltage of the Schottky diodes.

Further, in the embodiments described above, the switching transistors are all commonly connected at the source electrodes thereof, but may not always be configured necessarily. All the switching transistors are divided into a predetermined number of groups or blocks from the convenience of the circuit operation and/or pattern disposition, and are commonly connected at the source electrodes thereof at every switching transistors contained in the respective blocks.

What is claimed is:

1. A circuit for performing a logic operation on an input signal supplied to an input terminal and supplying an output signal from an output terminal, said circuit comprising:

(a) first and second terminals between which an external power source is connected and which are supplied with first and second voltages, respectively, the first voltage being higher than the second voltage;

(b) a plurality of logic elements connected in cascade between the signal input and output terminals, each of said logic elements including at least one switching transistor which comprises a depletion-mode field effect transistor having gate, drain and source electrodes, the source electrodes of the switching field effect transistors being connected to each other;

(c) load means connected between said first terminal and the drain electrode of each of said switching field effect transistors, for receiving an electric power from the external power source and for supplying a substantially constant current to said switching field effect transistor;

(d) voltage level-controlling means, connected between the second terminal and the connection point of the source electrodes of said switching field effect transistors, for maintaining the source electrodes at a predetermined third voltage lower than the first voltage and higher than the second voltage; and (e) level-shifting means for level-shifting the voltage at the drain electrodes of one switching field effect transistor of each logic element by a predetermined potential difference and applying the level-shifted drain electrode voltage to the gate electrode of said switching field effect transistor in the next succeeding logic element, said predetermined potential difference being such that a logic high voltage at said drain electrode of said switching field effect transistor biases said succeeding switching transistor into conductance, and a logic low voltage at said drain electrode of said switching field effect transistor biases said succeeding switching transistor into nonconductance.

2. A circuit according to claim 1, wherein said load means comprises a plurality of depletion-mode field effect transistors each having its respective gate electrode connected to its source electrode and a drain electrode connected to said first terminal.

3. A circuit according to claim 1, wherein said voltage level-controlling means comprises at least one voltage level-controlling device which receives substantially constant current flowing from the source electrodes of said switching field effect transistors to said second terminal and which generates a voltage drop therein in response to the current, thereby maintaining the source electrodes at the third voltage.

4. A circuit according to claim 1, wherein said voltage level-controlling means comprises a plurality of voltage level-controlling devices which receive substantially constant current flowing from the source electrodes of said switching field effect transistors to said second terminal and which generate a voltage drop therein in response to the current, thereby maintaining the source electrodes at the third voltage, said voltage level controlling devices being connected between said source electrodes and second terminal in parallel with each other.

5. A circuit according to claim 3, wherein said voltage level-controlling device comprises a resistor.

6. A circuit according to claim 3, wherein said voltage level-controlling device comprises a semiconductor diode having an anode connected to the source electrodes of said switching field effect transistors and a cathode connected to said second terminal.

7. A circuit according to claim 6, wherein said semiconductor diode comprises a Schottky diode.

8. A circuit according to claim 3, wherein said voltage level-controlling device comprises a plurality of series-connected semiconductor diodes.

9. A circuit according to claim 1, which further comprises means connected in parallel with said voltage level-controlling means and to said second terminal, for suppressing the variation in the third voltage and for preventing the variation in the level shift voltage.

10. A circuit according to claim 9, which further comprises means for absorbing pulse noise generated at the commonly connected source electrodes of said switching field effect transistors, said pulse noise absorbing means including at least one reverse-biased semiconductor diode having an anode electrode connected to said second terminal and a cathode electrode connected to said commonly connected source electrodes.

11. A circuit according to claim 9, wherein said level-shift voltage variation-suppressing means comprises a deletion-mode field effect transistor having a drain electrode connected to said level-shifting means and gate and source electrodes commonly connected to said second terminal.

12. A circuit according to claim 1, wherein said level-shifting means comprises a level shifting device connected between at least a pair of switching field effect transistors respectively included in said logic elements adjacent to each other.

13. A circuit according to claim 12, wherein said level-shifting device is connected between the drain electrode of the switching field effect transistor of the previous logic element of said pair of switching field effect transistors and the gate electrode of the switching field effect transistor of the following logic element.

14. A circuit according to claim 13, wherein said level-shifting device includes at least one semiconductor diode having a cathode electrode connected to the gate electrode of said following stage switching field effect transistor.

15. A circuit according to claim 13, wherein said level-shifting device includes a resistor.

16. A circuit according to claim 13, wherein said level-shifting device includes a series connection of a plurality of semiconductor diodes.

17. A circuit according to any one of claims 14 or 16, wherein said semiconductor diode includes a Schottky diode.

18. A circuit according to claim 13, wherein said level-shifting device includes a depletion-mode field effect transistor having a drain electrode connected to said first terminal, gate electrode connected to the drain electrode of said previous logic element switching field effect transistor and a source electrode connected to the gate electrode of said following logic element switching field effect transistor.

19. A circuit according to claim 1, wherein at least one of said logic elements includes a plurality of switching transistors having their drain-source current paths connected in parallel and which are depletion-mode field effect transistors.

20. A circuit according to claim 1, wherein at least one of said logic elements includes a plurality of switching transistors which are depletion-mode field effect transistors and which are connected in series with each other.

* * * * *